US006622202B2

United States Patent
Carroll et al.

(10) Patent No.: US 6,622,202 B2
(45) Date of Patent: Sep. 16, 2003

(54) METHOD AND DEVICE FOR OPERATING A RAM MEMORY

(75) Inventors: Steven Raymond Carroll, Sale (GB); Ian David Johnson, Littlehampton (GB)

(73) Assignee: Xyratex Technology Limited, Havant (GB)

( * ) Notice: Subject to any disclaimer, the term of this patent is extended or adjusted under 35 U.S.C. 154(b) by 87 days.

(21) Appl. No.: 09/850,245

(22) Filed: May 7, 2001

(65) Prior Publication Data

US 2002/0129194 A1 Sep. 12, 2002

(30) Foreign Application Priority Data

Dec. 28, 2000 (GB) ............................................. 0031733

(51) Int. Cl.[7] ............................................... G06F 12/08
(52) U.S. Cl. ....................... 711/104; 711/167; 713/400; 713/401; 713/500; 713/501; 713/502; 713/503
(58) Field of Search ................................ 711/104–167; 713/400, 401, 500–503

(56) References Cited

U.S. PATENT DOCUMENTS

| | | | |
|---|---|---|---|
| 5,748,558 A | 5/1998 | Suzuki | |
| 5,953,738 A | 9/1999 | Rao | |
| 5,996,052 A | 11/1999 | Taniguchi et al. | |
| 6,029,250 A | * 2/2000 | Keeth | 713/400 |
| 6,044,429 A | 3/2000 | Ryan et al. | |
| 6,075,740 A | 6/2000 | Leung | |
| 6,393,542 B1 | * 5/2002 | Kohiyama | 711/167 |
| 6,401,213 B1 | * 6/2002 | Jeddeloh | 713/401 |

FOREIGN PATENT DOCUMENTS

| | | |
|---|---|---|
| EP | 0400851 | 12/1990 |
| EP | 0961284 A2 | 12/1999 |
| GB | 2244158 | 11/1991 |
| JP | 1234947 | 9/1989 |
| WO | WO 00/38375 | 6/2000 |

* cited by examiner

Primary Examiner—Do Hyun Yoo
Assistant Examiner—Ngoc V Dinh
(74) Attorney, Agent, or Firm—Bracewell & Patterson, L.L.P.

(57) ABSTRACT

A method of operating a RAM memory having a plurality of memory addresses for storing data, the method being performed with a timing based on clock signals spaced by clock periods and comprising the steps of: receiving an address and a function signal specifying a function to be performed on data associated with that address; determining whether the same address has been received during a predefined number of preceding clock periods; generating a first data item representing data associated with the received address; modifying the first item according to the function signal to generate a second data item associated with the address, and writing the second data item to the address in the RAM and retaining a separate record of the last n second data items, the step of generating a first data item being performed by: (i) if the result of the determination is negative, generating the first data item to be equal to data stored by the RAM in the address, and (ii) if the result of the determination is positive, generating the first data item to be equal to the most recent second item associated with the address which is stored in the record.

14 Claims, 1 Drawing Sheet

METHOD AND DEVICE FOR OPERATING A RAM MEMORY

FIELD OF THE INVENTION

The present invention relates to a method and device for operating a RAM memory having a plurality of memory addresses for storing data, and further relates to a data switching fabric incorporating such a device.

BACKGROUND OF THE INVENTION

Our patent application PCT/GB99103748, published as WO 00/38375, the contents of which are incorporated herein by reference, describes a data switching method and apparatus. The switch comprises input traffic managers, ingress routers, a memoryless cyclic switch fabric, egress routers and output traffic managers, all acting under the control of a switch controller. Each ingress router includes a set of virtual output queues (VOQs), one for each traffic manager and each message priority.

The large number of VOQs supported makes it undesirable to store the key parameters within registers or register files, and thus makes it necessary to store a variety of information relating to the VOQs within a RAM memory. The actual information stored relates to the length of the queues, head and tail pointers, urgency and bandwidth allocation, as explained in detail in WO00/38375. The length, head and tail pointers and urgency are updated each time a tensor is added to or removed from a VOQ, which can occur once per switch cycle.

Thus, in any given switch cycle, the RAM needs to be accessed to allow the queue details to be passed to the arbitration logic, so that the arbitration logic can select an appropriate queue from which to remove a tensor. Once the arbitration logic has selected a queue, the RAM needs to be read, the parameters updated and then written back. Each time a tensor is stored in a VOQ, the parameter RAM needs to be read, the parameters updated and then written back.

This large number of RAM accesses within a single switch cycle is difficult to perform using a conventional RAM memory based on clock cycles. For example, the specification of the RAM memory may be such that it is impossible to write to a particular address in a given clock period, and to read data from that address in the next clock period.

SUMMARY OF THE INVENTION

The present invention seeks to address the above problem, and to provide new and useful methods and devices for operating a RAM memory.

The devices find particular application to control a data switching fabric, although the invention is not necessarily limited to this application.

In general terms, the invention proposes that a device operating a RAM memory employs a number of data registers which keep a separate record of data which has been transmitted to the RAM so recently that it has either not yet been written there, or, if it has been written to the RAM, that it is not yet available for retrieval from it. When the device receives an instruction to perform a function on data which is in this position, it reads it from the registers rather than the RAM. The present invention may thus make it possible to overcome limitations in the specification of the RAM, and in particularly preferred embodiments to process instructions in respect of the same RAM address in consecutive clock cycles.

Specifically, in a first aspect the invention proposes a method of operating a RAM memory having a plurality of memory addresses for storing data, the method being performed with a timing based on clock signals spaced by clock periods and comprising the steps of:

receiving an address and a function signal specifying a function to be performed on data associated with that address;

determining whether the same address has been received during a predefined number of preceding clock periods;

generating a first data item representing data associated with the received address;

modifying the first item according to the function signal to generate a second data item associated with the address, and writing the second data item to the address in the RAM and retaining a separate record of the last n second data items, the step of generating a first data item being performed by:
 (i) if the result of the determination is negative, generating the first data item to be equal to data stored by the RAM in the address, and
 (ii) if the result of the determination is positive, generating the first data item to be equal to the most recent second item associated with the address which is stored in the record.

In order to ensure that the data from the RAM is reliable, the predetermined number should be at least as high as the number of clock periods required to write data into a given address of the RAM plus the number of clock periods required to read that data from the address in the RAM. In other words, the determination indicates whether there is a risk that data accessed from the RAM is not reliably up-to-date, that is to say whether that the output of the RAM relating to a certain address may not be the result of the most recent function performed in respect of that address. If the result of the determination is positive, then this means that the output of the RAM is unreliable in the sense that a more recent function may have been performed in relation to that address, and so the separate record must be relied upon.

The present invention may alternatively be expressed as a device for controlling a RAM. Specifically, the second expression of the present invention is a device for operating a RAM memory having a plurality of memory addresses for storing data, the device being arranged to employ clock signals spaced by clock periods, and the device comprising:

reception means for receiving an address and a function signal specifying a function to be performed on data associated with that address;

comparison means for determining whether the same address has been received during a predefined number of preceding clock periods;

generation means for generating a first data item representing data associated with the received address; and modification means for modifying the first item according to the function signal to generate a second data item associated with the address, and writing the second data item to the address, record means for transmitting to the generating means each of the last n second data items wherein the generation means is arranged to generate the first data item by:
 (i) if the result of the determination is negative, generating the first data item as the data stored by the RAM in the address, and (ii) if the result of the determination is positive, using the output of the record means to generate the first data item as the most recent second item associated with the address.

Furthermore, each of the above expressions of the invention may alternatively be expressed in terms of the action which is performed in each clock period.

Thus, in a third expression, the invention provides a method of operating a RAM memory having a plurality of memory addresses for storing data, the method being performed with a timing based on clock signals spaced by clock periods, and the method comprising in each clock period:

receiving an address and a function signal, the address and the function signal being associated with the present clock period, the function signal indicating a function to be performed on data associated with that address;

transmitting the received address to the RAM memory to extract the data stored at the address;

generating, from an address associated with a previous clock period, a determination signal associated with that previous clock period, the determination signal indicating a preceding clock period in which the same address was received, or that the same address was not received during a predetermined number n of preceding clock periods, where n is an integer which is at least two;

using the determination signal associated with a previous clock period, the data stored by the RAM in the address associated with that previous clock period, and the n second data items associated with each of the n clock periods preceding that previous clock period, to generate a first data item associated with that previous clock period, the first data item representing data associated with the address in that previous clock period;

modifying the first data item associated with a previous clock period according to the function signal associated with that clock period, to form a second data item associated with that previous clock period, and transmitting the second data item to the RAM and to the generating means;

the first data item associated with each given clock period being generated by,
(i) if the determination signal associated with that given clock period indicates a preceding clock period, generating the first data item to be equal to the second data item associated with that preceding clock period, and
(ii) otherwise, generating said first data item to be equal to data stored by the RAM during that given clock period at the address associated with that given clock period.

Similarly, in a fourth expression, the invention provides a device for operating a RAM memory having a plurality of memory addresses for storing data, the device being arranged to employ clock signals spaced by clock periods, and the device comprising:

reception means for receiving in each given clock period an address and a function signal, the address and the function signal being associated with the given clock period, the function signal indicating a function to be performed on data associated with that address;

transmission means for transmitting the address received in the given clock period to the RAM memory to extract the data stored at the address;

determination means for generating, from an address associated with a previous clock period previous to said given clock period, a determination signal associated with that previous clock period, the determination signal indicating a preceding clock period which preceded that previous clock period and in which the same address was received, or that the same address was not received during a predetermined number n of clock periods preceding that previous clock period;

generation means arranged to receive from the determination means the determination signal associated with a previous clock period, and to receive from the RAM the data stored by the RAM in the address associated with that previous clock period, and to generate a first data item associated with that previous clock period;

modification means for modifying the first data item associated with a previous clock period according to the function signal associated with that clock period, to form a second data item associated with that previous clock period, and transmitting the second data item to the RAM; and record means arranged to transmit to the generation means during each clock period each of the n second data items respectively generated during the preceding n clock periods;

wherein the generation means is arranged to generate the first data item associated with each given clock period by,
(i) if the determination signal associated with that given clock period indicates a preceding clock period, using the output of the record means to generate the first data item to be equal to the second data item associated with that preceding clock period, and
(ii) otherwise, generating said first data item to be equal to data stored by the RAM during that given clock period at the address associated with that given clock period.

Note that the precise setting of n depends upon the specification of the RAM being controlled. It may also depend upon any intermediate devices which, in some embodiments, it may be preferable to insert between a device which embodies the invention and the RAM itself, such as a separate register to store the second data items on their way to the RAM.

BRIEF DESCRIPTION OF THE FIGURES

An embodiment of the invention will now be described, for the sake of example only, with reference to FIG. 1, which illustrates a device according to the invention in combination with a RAM memory.

DETAILED DESCRIPTION OF THE EMBODIMENT

Figure 1:
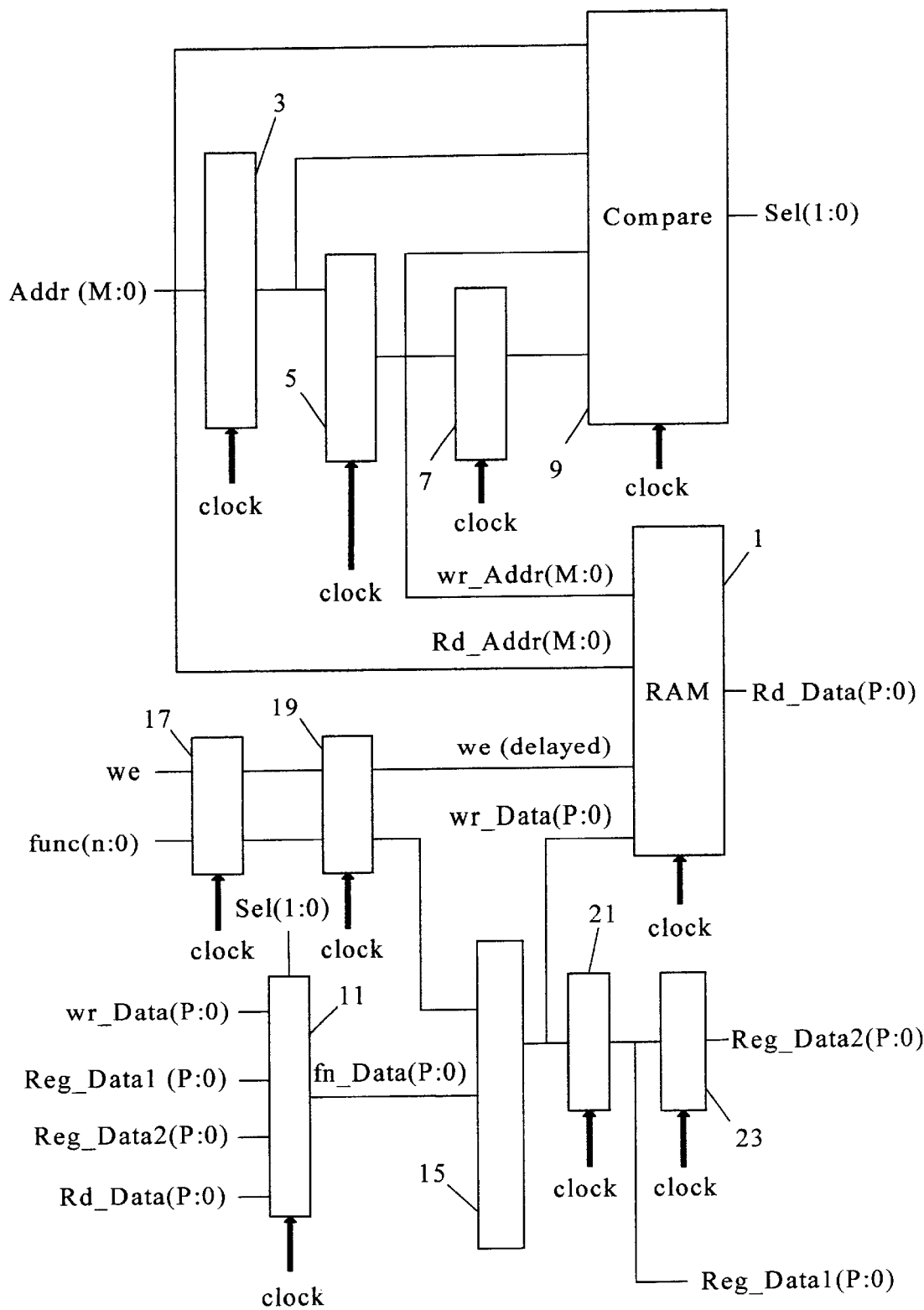

The embodiment of the invention illustrated in FIG. 1 in combination with a RAM memory 1, receives as inputs an address which is denoted Addr (M:0) (or more simply herein as "Addr"), a write enable signal (we) which indicates whether the RAM is to be updated as a result of the function, and an instruction func (n:0) (or more simply "func") specifying the function which is to be performed on data associated with address Addr.

The address Addr is transmitted to the RAM 1, and specifically to the input port Rd__Addr (M:0) which specifies the address from which the RAM 1 reads data to output. The RAM 1 is "clocked", which is to say that it receives a clock signal ("clock"), and after a certain number of clock signals transmits the data stored in the location Addr as the signal Rd__Data (P:0).

The address Addr is also transmitted to a clocked data register 3, which outputs it again after one clock signal. The output of the register 3 is sent to a clocked register 5, which outputs it after one clock signal. The output of the register 5 is sent to a clocked register 7, which outputs it after one clock signal. A compare unit 9 receives the signal Addr, and also the outputs of the register 3, 5, 7.

The compare unit 9 also receives a clock signal and at each clock signal outputs a signal Sel(1:0) which is determined by table 1.

TABLE 1

| Comparator Output - (Sel 1:0) | Description |
|---|---|
| 00 | Input address is the same as the last address |
| 01 | Input address is the same as the last-but-one, and different from the last address |
| 10 | Input address is the same as the last-but-two, and different from each of the last two addresses |
| 11 | Input address is not one of the last three addresses |

Therefore, the output of the compare unit 9 is "11" when address Addr is different from the address received in all of the three preceding clock cycles (which indicates that the data read from the RAM is reliable), and otherwise indicates for which of the three preceding clock cycles the received address was the same.

The output Sel (1:0) is an input to a MUX selector 11. The selector 11 is clocked and further receives as four inputs the signals wr_Data (P:0), Reg_Data 1 (P:0), Reg_Data2 (P:0), and Rd_Data (P:0), all of which are explained below. The output of the selector 11 is given by table 2.

TABLE 2

| Comparator Output-Sel (1:0) | Multiplexer Output - Fn_Data (P:O) |
|---|---|
| 00 | Wr_Data(P:0) |
| 01 | Reg_Data1(P:0) |
| 10 | Reg_Data2(P:0) |
| 11 | Rd_Data(P:0) |

The output of the selector 11 is transmitted to a processor 15. In the embodiment of FIG. 1 this processor is not clocked, but in other embodiments it may be.

The signal func received by the embodiment is first transmitted to a clocked control register 17, which outputs it after one clock cycle, and then to a second clocked control register 19 which further delays it by a clock cycle. From there the function is transmitted to the processor 15. Note that it takes two clock periods for an address signal Addr to affect the input fn_Data (P:0) to the processor 15. Thus, the two inputs to the processor 15 are derived from signals Addr and func which were input to the embodiment during the same clock cycle.

The output from the processor wr_Data (P:0) is transmitted to the input of the RAM 1 which receives data to be written to the RAM. The address to which this data is written is the input to port wr_Addr(M:0). This input is set to be the signal received from the register 5, that is the Addr received two clock cycles earlier. The processor 15 takes a time to operate which is short compared to a clock period. In other words, following a clock signal which transmits data to the processor 15, its output is available at the input to the RAM 1 at the next clock signal. Therefore, the data wr_Data(P:0) effectively reaches the RAM 1 in the same clock period as the address wr_Addr (M:0) which caused that data to be produced.

The RAM shown in FIG. 1 has a specification such that when data is written to a certain address in a certain clock cycle, it is only possible to extract that data on the next but one clock cycle. In other words, the output Rd_Data(P:0) of the RAM is only reliable, in the sense defined above, after three clock cycles, and only in the case that no instructions in respect of the same address are received during this period.

The output wr_Data(P:0) is written to a clocked data register 21, which outputs it after one clock period as the signal Reg_Data1 (P:0). This signal is then sent to the clocked data register 23, which outputs it after one clock period as the signal Reg_Data2(P:0).

All three of the signals wr_Data(P:0), Reg_Data1(P:0) and Reg_Data2(P:0) are transmitted without delay to the selector 11, which thus has available to it the last three outputs of the processor 15. The processor MUX further has available to it data Rd_Data(P:0), which is the data output by the RAM during the previous clock period, and each of the preceding three second data items generated by the processor 15. The determination signal Sel(1:0) tells it which of these four input signals is the appropriate one to be processed by the processor 15.

Note that many variations of the embodiment above are possible, depending for example on the specification of the RAM. For example, if the RAM were such that data written to a certain address in one clock cycle could be read from that address on the next clock cycle, then the data register 23 could be omitted, since that would have the consequence that the output of the RAM is "reliable" in the sense defined above one clock cycle earlier.

Whilst endeavouring in the foregoing specification to draw attention to those features of the invention believed to be of particular importance, it should be understood that the Applicant claims protection in respect of any patentable feature or combination of features disclosed herein and/or shown in the drawings whether or not particular emphasis has been placed on such feature or features.

What is claimed is:

1. A method of operating a RAM memory having a plurality of memory addresses for storing data, the method being performed with a timing based on clock signals spaced by clock periods and comprising the steps of:

receiving an address and a function signal specifying a function to be performed on data associated with that address;

determining whether the same address has been received during a predefined number of preceding clock periods;

generating a first data item representing data associated with the received address;

modifying the first item according to the function signal to generate a second data item associated with the address, and writing the second data item to the address in the RAM and retaining a separate record of the last n second data items, the step of generating a first data item being performed by:
   (i) if the result of the determination is negative, generating the first data item to be equal to data stored by the RAM in the address, and (ii) if the result of the determination is positive, generating the first data item to be equal to the most recent second item associated with the address which is stored in the record.

2. A method according to claim 1 in which the determining step is performed by generating a determination signal indicating either the most recent of the predetermined number of preceding clock periods in which a second data item associated with the received address was generated, or that no second data item associated with the received address was generated during the predetermined number of preceding clock periods, and said step of generating the second item is performed by selecting, based on the determination signal, one of the predetermined number of preceding second data items from the record or the data stored by the RAM in the received address of the RAM.

3. A method according to claim 1 in which the predetermined number is at least equal to the number of clock periods required to write data into an address of the RAM plus the number of clock periods required to read that data from the address in the RAM.

4. A method according to claim 1 in which said modifying step is performed by a unit which receives the first data item and the corresponding function signal during the same clock period.

5. A method according to claim 1 in which said modifying step is performed a number of clock cycles after the address is received which is at least equal to the number of clock cycles required to read data from RAM, plus one.

6. A method of operating a RAM memory having a plurality of memory addresses for storing data, the method being performed with a timing based on clock signals spaced by clock periods, and the method comprising in each clock period:

receiving an address and a function signal, the address and the function signal being associated with the present clock period, the function signal indicating a function to be performed on data associated with that address;

transmitting the received address to the RAM memory to extract the data stored at the address;

generating, from an address associated with a previous clock period, a determination signal associated with that previous clock period, the determination signal indicating a preceding clock period in which the same address was received, or that the same address was not received during a predetermined number n of preceding clock periods, where n is an integer which is at least two;

using the determination signal associated with a previous clock period, the data stored by the RAM in the address associated with that previous clock period, and the n second data items associated with each of the n clock periods preceding that previous clock period, to generate a first data item associated with that previous clock period, the first data item representing data associated with the address in that previous clock period;

modifying the first data item associated with a previous clock period according to the function signal associated with that clock period, to form a second data item associated with that previous clock period, and transmitting the second data item to the RAM and to the generating means;

the first data item associated with each given clock period being generated by,
(i) if the determination signal associated with that given clock period indicates a preceding clock period, generating the first data item to be equal to the second data item associated with that preceding clock period, and
(ii) otherwise, generating said first data item to be equal to data stored by the RAM during that given clock period at the address associated with that given clock period.

7. A device for operating a RAM memory having a plurality of memory addresses for storing data, the device being arranged to employ clock signals spaced by clock periods, and the device comprising:

reception means for receiving an address and a function signal specifying a function to be performed on data associated with that address;

comparison means for determining whether the same address has been received during a predefined number of preceding clock periods;

generation means for generating a first data item representing data associated with the received address; and modification means for modifying the first item according to the function signal to generate a second data item associated with the address, and writing the second data item to the address, record means for transmitting to the generating means each of the last n second data items wherein the generation means is arranged to generate the first data item by:
(i) if the result of the determination is negative, generating the first data item as the data stored by the RAM in the address, and
(ii) if the result of the determination is positive, using the output of the record means to generate the first data item as the most recent second item associated with the address.

8. A device according to claim 7 in which the determining means is arranged to generate a determination signal indicating either the most recent of the predetermined number of preceding clock periods in which a second data item associated with the received address was generated, or that no second data item associated with the received address was generated during the predetermined number of preceding clock periods, and the generation means is arranged to select, based on the determination signal, one of the predetermined number of preceding second data items or the data stored by the RAM in the received address of the RAM.

9. A device according to claim 8 in which n is at least 2, the record means comprises (n−1) data registers arranged to receive from the modification means, and to store, the (n−1) second data items generated during the preceding (n−1) clock periods, and to transmit to the generating means from the modification means the second data item generated in the present clock period.

10. A device according to claim 7 in which the modification means is arranged to receive the first data item and the function signal during the same clock period.

11. A device according to claim 7 further comprising means for transmitting a received write enable signal to the RAM memory with a predetermined delay.

12. A device for operating a RAM memory having a plurality of memory addresses for storing data, the device being arranged to employ clock signals spaced by clock periods, and the device comprising:

reception means for receiving in each given clock period an address and a function signal, the address and the function signal being associated with the given clock period, the function signal indicating a function to be performed on data associated with that address;

transmission means for transmitting the address received in the given clock period to the RAM memory to extract the data stored at the address;

determination means for generating, from an address associated with a previous clock period previous to said given clock period, a determination signal associated with that previous clock period, the determination signal indicating a preceding clock period which preceded that previous clock period and in which the same address was received, or that the same address was not received during a predetermined number n of clock periods preceding that previous clock period;

generation means arranged to receive from the determination means the determination signal associated with a previous clock period, and to receive from the RAM the data stored by the RAM in the address associated with that previous clock period, and to generate a first data item associated with that previous clock period;

modification means for modifying the first data item associated with a previous clock period according to the function signal associated with that clock period, to form a second data item associated with that previous clock period, and transmitting the second data item to the RAM; and record means arranged to transmit to the generation means during each clock period each of the n second data items respectively generated during the preceding n clock periods;

wherein the generation means is arranged to generate the first data item associated with each given clock period by, (i) if the determination signal associated with that given clock period indicates a preceding clock period, using the output of the record means to generate the first data item to be equal to the second data item associated with that preceding clock period, and (ii) otherwise, generating said first data item to be equal to data stored by the RAM during that given clock period at the address associated with that given clock period.

13. A control device for a data switching fabric, the control device employing a RAM memory and a device according to claim 7 for operating the RAM memory.

14. A control device for a data switching fabric, the control device employing a RAM memory and a device according to claim 12 for operating the RAM memory.

* * * * *